United States Patent
Ware et al.

(10) Patent No.: US 10,664,344 B2
(45) Date of Patent: *May 26, 2020

(54) MEMORY REPAIR METHOD AND APPARATUS BASED ON ERROR CODE TRACKING

(71) Applicant: Rambus Inc., Sunnyvale, CA (US)

(72) Inventors: Frederick A. Ware, Los Altos Hills, CA (US); Ely Tsern, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 111 days.

This patent is subject to a terminal disclaimer.

(21) Appl. No.: 15/829,682

(22) Filed: Dec. 1, 2017

(65) Prior Publication Data

US 2018/0143873 A1 May 24, 2018

Related U.S. Application Data

(63) Continuation of application No. 15/250,677, filed on Aug. 29, 2016, now Pat. No. 9,836,348, which is a
(Continued)

(51) Int. Cl.
*G06F 11/00* (2006.01)
*G06F 11/10* (2006.01)
(Continued)

(52) U.S. Cl.
CPC ...... *G06F 11/1044* (2013.01); *G06F 11/1048* (2013.01); *G06F 11/1068* (2013.01);
(Continued)

(58) Field of Classification Search
CPC ............ G06F 11/1044; G06F 11/1048; G06F 11/1068
See application file for complete search history.

(56) References Cited

U.S. PATENT DOCUMENTS

| 4,139,148 A | 2/1979 | Scheuneman et al. |
| 4,748,627 A | 5/1988 | Ohsawa |

(Continued)

OTHER PUBLICATIONS

Sun, Hongbin et al., "Cost-efficient built-in repair analysis for embedded memories with on-chip ECC," 2011 1st International Symposium on Access Spaces (ISAS), pp. 95,100, Jun. 17-19, 2011. 6 pages.

(Continued)

*Primary Examiner* — Esaw T Abraham
(74) *Attorney, Agent, or Firm* — Lance Kreisman; Peninsula Patent Group

(57) ABSTRACT

A memory module is disclosed that includes a substrate, a memory device that outputs read data, and a buffer. The buffer has a primary interface for transferring the read data to a memory controller and a secondary interface coupled to the memory device to receive the read data. The buffer includes error logic to identify an error in the received read data and to identify a storage cell location in the memory device associated with the error. Repair logic maps a replacement storage element as a substitute storage element for the storage cell location associated with the error.

20 Claims, 8 Drawing Sheets

Related U.S. Application Data continuation of application No. 14/285,481, filed on May 22, 2014, now Pat. No. 9,430,324.

(60) Provisional application No. 61/827,383, filed on May 24, 2013.

(51) Int. Cl.

| | | |
|---|---|---|
| *G06F 11/16* | (2006.01) | |
| *G11C 29/42* | (2006.01) | |
| *G11C 29/44* | (2006.01) | |
| *G11C 7/10* | (2006.01) | |
| *G11C 29/52* | (2006.01) | |
| *G11C 29/00* | (2006.01) | |
| *H03M 13/15* | (2006.01) | |
| *G06F 11/20* | (2006.01) | |

(52) U.S. Cl.
CPC ............ *G06F 11/1666* (2013.01); *G11C 7/10* (2013.01); *G11C 29/42* (2013.01); *G11C 29/4401* (2013.01); *G11C 29/52* (2013.01); *G11C 29/70* (2013.01); *H03M 13/1575* (2013.01); *G06F 11/20* (2013.01); *G11C 29/765* (2013.01); *G11C 2029/4402* (2013.01)

(56) References Cited

U.S. PATENT DOCUMENTS

| | | | |
|---|---|---|---|
| 5,459,742 A | 10/1995 | Cassidy et al. | |
| 5,754,753 A | 5/1998 | Smelser | |
| 6,240,525 B1 * | 5/2001 | Chiang ................ | G11C 29/76 365/201 |
| 6,601,194 B1 * | 7/2003 | Dahn ................... | G11C 29/785 365/200 |
| 6,973,613 B2 | 12/2005 | Cypher | |
| 6,996,766 B2 | 2/2006 | Cypher | |
| 7,188,296 B1 | 5/2007 | Cypher | |
| 7,379,361 B2 | 5/2008 | Co et al. | |
| 7,404,118 B1 | 7/2008 | Baguette et al. | |
| 7,475,326 B2 | 1/2009 | Hillman | |
| 7,487,428 B2 | 2/2009 | Co et al. | |
| 7,768,847 B2 | 8/2010 | Ong et al. | |
| 8,010,875 B2 | 8/2011 | Gara et al. | |
| 8,015,438 B2 | 9/2011 | Bruennert et al. | |
| 8,024,638 B2 | 9/2011 | Resnick et al. | |
| 8,208,325 B2 | 6/2012 | Urakawa et al. | |
| 8,315,116 B2 | 11/2012 | Kim et al. | |
| 8,386,833 B2 | 2/2013 | Smith et al. | |
| 8,436,344 B2 | 5/2013 | Seo et al. | |
| 8,640,006 B2 | 1/2014 | Carman et al. | |
| 8,850,296 B2 | 9/2014 | Weingarten et al. | |
| 9,087,613 B2 | 7/2015 | Sohn et al. | |
| 2002/0046358 A1 * | 4/2002 | Terzioglu ................ | G11C 7/06 714/6.3 |
| 2005/0015654 A1 * | 1/2005 | Marr ...................... | G11C 29/83 714/6.2 |
| 2005/0039073 A1 * | 2/2005 | Hartmann ............. | G11C 29/40 714/6.2 |
| 2007/0121370 A1 * | 5/2007 | Ellis ......................... | G11C 5/14 365/154 |
| 2007/0255981 A1 | 11/2007 | Eto | |
| 2012/0281348 A1 | 11/2012 | Harashima et al. | |
| 2013/0058145 A1 | 3/2013 | Yu et al. | |

OTHER PUBLICATIONS

Wu, Tze-Hsin et al. "A memory yield improvement scheme combining built-in self-repair and error correction codes," 2012 IEEE International Test Conference (ITC), pp. 1-9, Nov. 5-8, 2012. 9 pages.

* cited by examiner

FIG. 6 [MULTIPLY & DIVIDE OPS]

| Multiplier \ Multiplicand | 0 | 1 | 2 | 3 | 4 | 5 | 6 | 7 | 8 | 9 | a | b | c | d | e | f |
|---|---|---|---|---|---|---|---|---|---|---|---|---|---|---|---|---|
| Product | | | | | | | | | | | | | | | | |
| 0 | 0 | 0 | 0 | 0 | 0 | 0 | 0 | 0 | 0 | 0 | 0 | 0 | 0 | 0 | 0 | 0 |
| 1 | 0 | 1 | 2 | 3 | 4 | 5 | 6 | 7 | 8 | 9 | a | b | c | d | e | f |
| 2 | 0 | 2 | 4 | 6 | 8 | a | c | e | 3 | 1 | 7 | 5 | b | 9 | f | d |
| 3 | 0 | 3 | 6 | 5 | c | f | a | 9 | b | 8 | d | e | 7 | 4 | 1 | 2 |
| 4 | 0 | 4 | 8 | c | 3 | 7 | b | f | 6 | 2 | e | a | 5 | 1 | d | 9 |
| 5 | 0 | 5 | a | f | 7 | 2 | d | 8 | e | b | 4 | 1 | 9 | c | 3 | 6 |
| 6 | 0 | 6 | c | a | b | d | 7 | 1 | 5 | 3 | 9 | f | e | 8 | 2 | 4 |
| 7 | 0 | 7 | e | 9 | f | 8 | 1 | 6 | d | a | 3 | 4 | 2 | 5 | c | b |
| 8 | 0 | 8 | 3 | b | 6 | e | 5 | d | c | 4 | f | 7 | a | 2 | 9 | 1 |
| 9 | 0 | 9 | 1 | 8 | 2 | b | 3 | a | 4 | d | 5 | c | 6 | f | 7 | e |
| a | 0 | a | 7 | d | e | 4 | 9 | 3 | f | 5 | 8 | 2 | 1 | b | 6 | c |
| b | 0 | b | 5 | e | a | 1 | f | 4 | 7 | c | 2 | 9 | d | 6 | 8 | 3 |
| c | 0 | c | b | 7 | 5 | 9 | e | 2 | a | 6 | 1 | d | f | 3 | 4 | 8 |
| d | 0 | d | 9 | 4 | 1 | c | 8 | 5 | 2 | f | b | 6 | 3 | e | a | 7 |
| e | 0 | e | f | 1 | d | 3 | 2 | c | 9 | 7 | 6 | 8 | 4 | a | b | 5 |
| f | 0 | f | d | 2 | 9 | 6 | 4 | b | 1 | e | c | 3 | 8 | 7 | 5 | a |

| Dividend \ Divisor | 0 | 1 | 9 | e | d | b | 7 | 6 | f | 2 | a | 5 | c | 4 | 3 | 8 |
|---|---|---|---|---|---|---|---|---|---|---|---|---|---|---|---|---|
| Remainder | | | | | | | | | | | | | | | | |
| 0 | 0 | 0 | 0 | 0 | 0 | 0 | 0 | 0 | 0 | 0 | 0 | 0 | 0 | 0 | 0 | 0 |
| 1 | 0 | 1 | 2 | 3 | 4 | 5 | 6 | 7 | 8 | 9 | a | b | c | d | e | f |
| 2 | 0 | 2 | 4 | 6 | 8 | a | c | e | 3 | 1 | 7 | 5 | b | 9 | f | d |
| 3 | 0 | 3 | 6 | 5 | c | f | a | 9 | b | 8 | d | e | 7 | 4 | 1 | 2 |
| 4 | 0 | 4 | 8 | c | 3 | 7 | b | f | 6 | 2 | e | a | 5 | 1 | d | 9 |
| 5 | 0 | 5 | a | f | 7 | 2 | d | 8 | e | b | 4 | 1 | 9 | c | 3 | 6 |
| 6 | 0 | 6 | c | a | b | d | 7 | 1 | 5 | 3 | 9 | f | e | 8 | 2 | 4 |
| 7 | 0 | 7 | e | 9 | f | 8 | 1 | 6 | d | a | 3 | 4 | 2 | 5 | c | b |
| 8 | 0 | 8 | 3 | b | 6 | e | 5 | d | c | 4 | f | 7 | a | 2 | 9 | 1 |
| 9 | 0 | 9 | 1 | 8 | 2 | b | 3 | a | 4 | d | 5 | c | 6 | f | 7 | e |
| a | 0 | a | 7 | d | e | 4 | 9 | 3 | f | 5 | 8 | 2 | 1 | b | 6 | c |
| b | 0 | b | 5 | e | a | 1 | f | 4 | 7 | c | 2 | 9 | d | 6 | 8 | 3 |
| c | 0 | c | b | 7 | 5 | 9 | e | 2 | a | 6 | 1 | d | f | 3 | 4 | 8 |
| d | 0 | d | 9 | 4 | 1 | c | 8 | 5 | 2 | f | b | 6 | 3 | e | a | 7 |
| e | 0 | e | f | 1 | d | 3 | 2 | c | 9 | 7 | 6 | 8 | 4 | a | b | 5 |
| f | 0 | f | d | 2 | 9 | 6 | 4 | b | 1 | e | c | 3 | 8 | 7 | 5 | a |

FIG. 7 [COEFF TABLE]

| nibble | 00 | 01 | 02 | 03 | 04 | 05 | 06 | 07 | 08 | 09 | 0a | 0b | 0c | 0d | 0e | 0f | 10 | 11 | 12 | 13 | 14 | 15 | 16 | 17 | 18 | 19 | 1a | 1b | 1c | 1d | 1e | 1f |
|---|---|---|---|---|---|---|---|---|---|---|---|---|---|---|---|---|---|---|---|---|---|---|---|---|---|---|---|---|---|---|---|---|
| | | | | | | | | | | | | | | | | | | | | | | | | | | | | | | | | |
| syndrome | | | | | | | | | | | | | Kij coefficient | | | | | | | | | | | | | | | | | | | |
| 0 | | 1 | 2 | 3 | 4 | 5 | 6 | 7 | 8 | 9 | a | b | c | d | e | f | | 1 | 2 | 3 | 4 | 5 | 6 | 7 | 8 | 9 | a | b | c | d | e | f |
| 1 | | 1 | 1 | 1 | 1 | 1 | 1 | 1 | 1 | 1 | 1 | 1 | 1 | 1 | 1 | 1 | | 0 | 0 | 0 | 0 | 0 | 0 | 0 | 0 | 0 | 0 | 0 | 0 | 0 | 0 | 0 |
| 2 | | 0 | 0 | 0 | 0 | 0 | 0 | 0 | 0 | 0 | 0 | 0 | 0 | 0 | 0 | 0 | | 1 | 1 | 1 | 1 | 1 | 1 | 1 | 1 | 1 | 1 | 1 | 1 | 1 | 1 | 1 |
| 3 | | 1 | e | d | b | 7 | 6 | f | 2 | c | 5 | a | 4 | 3 | 8 | 1 | | 9 | e | d | b | 7 | 6 | f | 2 | c | 5 | a | 4 | 3 | 8 | 1 |

MEMORY REPAIR METHOD AND APPARATUS BASED ON ERROR CODE TRACKING

CROSS-REFERENCE TO RELATED APPLICATIONS

This application is a Continuation of U.S. patent application Ser. No. 15/250,677, filed Aug. 29, 2016, entitled MEMORY REPAIR METHOD AND APPARATUS BASED ON ERROR CODE TRACKING, now U.S. Pat. No. 9,836,348, which is a Non-Provisional that claims priority to U.S. patent application Ser. No. 14/285,481, filed May 22, 2014, entitled MEMORY REPAIR METHOD AND APPARATUS BASED ON ERROR CODE TRACKING, now U.S. Pat. No. 9,430,324, which is a Non-Provisional that claims priority to U.S. Provisional Application No. 61/827,383, filed May 24, 2013, entitled MEMORY REPAIR METHOD AND APPARATUS BASED ON ERROR CODE TRACKING, all of which are incorporated herein by reference in their entirety.

TECHNICAL FIELD

The disclosure herein relates to memory systems, and more specifically to in-system memory repair apparatus and methods.

BACKGROUND

Error codes are used in a variety of signaling systems to detect and, in some cases, correct errors relating to data transmission and storage. The codes generally provide redundancy to the original data so that, when the data is encoded via a particular error code algorithm, a limited number of data errors may be identified and possibly corrected upon decoding. The redundant portions of the encoded data may take the form of checksums, parity bits, or the like, depending on the type of error code employed.

For memory systems that employ error codes, the overhead often employed with the encoding generally limits the effectiveness of the code to a single-bit error in a given word. As a result, only a certain number of hard errors, such as those caused by storage cell failures, may be acceptable for a given memory component before the component fails as a reliable device. The failures become even more costly when memory devices are assembled onto memory modules, and the modules discarded for failing to pass final testing.

BRIEF DESCRIPTION OF THE DRAWINGS

Embodiments of the disclosure are illustrated by way of example, and not by way of limitation, in the figures of the accompanying drawings and in which like reference numerals refer to similar elements and in which:

FIG. 6 illustrates multiply and divide tables for one embodiment of an error encoder for use in the buffer of FIG. 3.

FIG. 7 illustrates a Kij coefficient table for one embodiment of an error encoder for use in the buffer of FIG. 3.

DETAILED DESCRIPTION

Embodiments of memory systems, modules, buffer devices and memory devices, and associated methods are disclosed herein. One embodiment of a memory module includes a substrate, a memory device that outputs read data, and a buffer. The buffer has a primary interface for transferring the read data to a memory controller and a secondary interface coupled to the memory device to receive the read data. The buffer includes error logic to identify an error in the received read data and to identify a storage cell location in the memory device associated with the error. Repair logic maps a replacement storage element as a substitute storage element for the storage cell location associated with the error. This in-module repair capability prevents hard errors from recurring, thereby preserving the error correction capability for detecting and correcting one or more other errors. Moreover, by incorporating the repair capability in a buffer circuit on the memory module, the memory device and memory controller designs may remain unchanged, while the memory system benefits from the additional layer of error correction capability.

In a further embodiment, a method of operation in a memory module is disclosed. The method includes accessing a read data word in a group of storage cells in response to a read operation request from a memory controller. The read data word is then transferred from the group of storage cells along a secondary data bus and buffered. The buffering includes determining whether an error exists in the read data word and repairing a failure associated with the error. Information regarding the repairing is stored for a subsequent read operation. The buffered read data word is transferred to a memory controller along a primary data bus as the determining and repairing takes place in the buffer.

In yet another embodiment, a method of operation in a memory module is disclosed. The method includes receiving data from a memory controller along primary data paths and buffering the received data. The buffering includes comparing addresses associated with the data to stored address information associated with known failures. If the comparing identifies a correlation between the data addresses and the stored address information, a data bit corresponding to the correlation is extracted from the data word and stored in a substitute storage location. The data is then transferred for storage in a memory device along secondary data paths.

Figure 1:
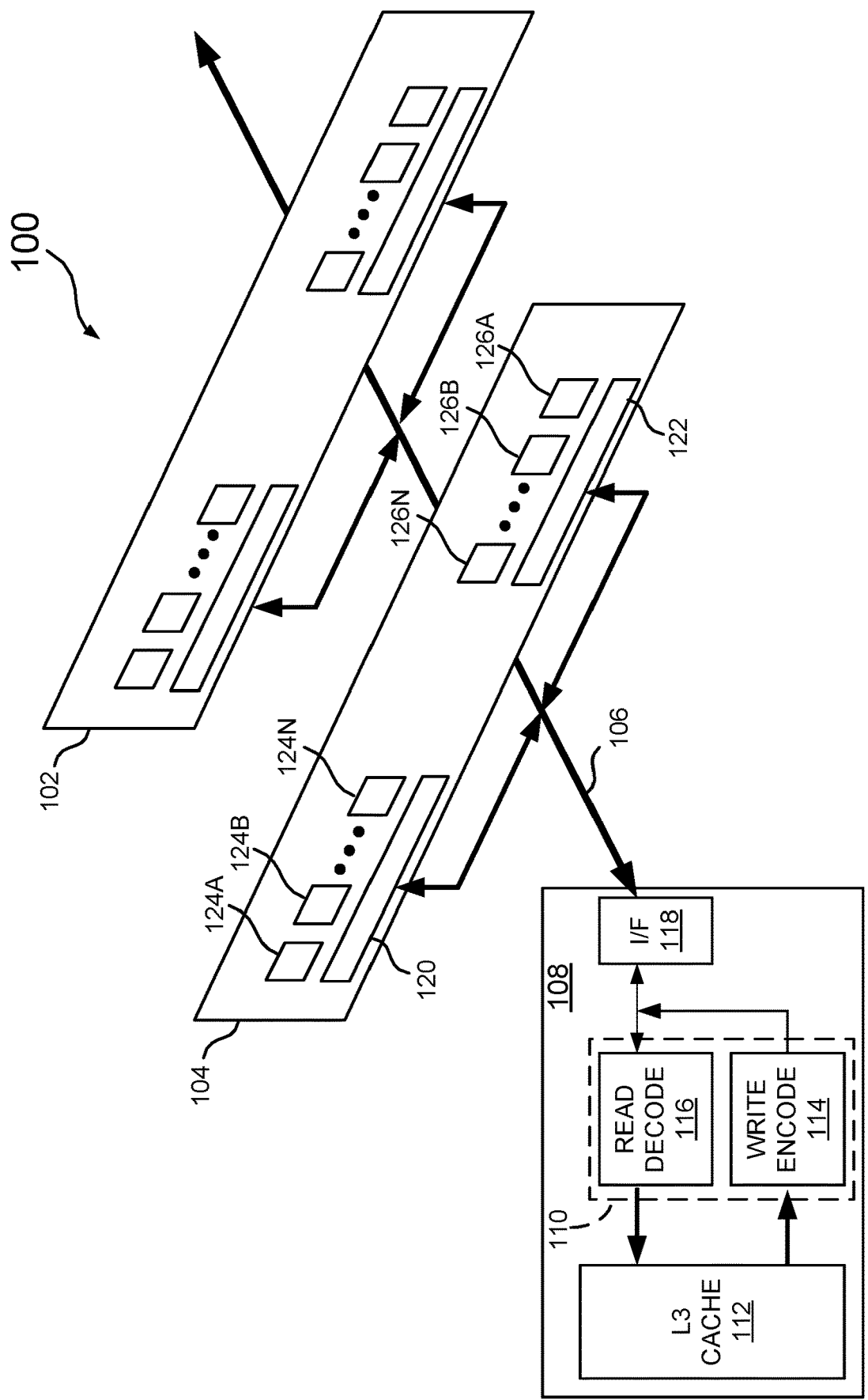
FIG. 1 illustrates one embodiment of a memory system that employs a memory controller and multiple memory modules.

Referring to FIG. 1, one embodiment of a buffered memory architecture, generally designated 100, employs multiple memory modules 102 and 104 coupled to a primary bus 106 that transfers data, command and address signals. Memory control circuitry 108 in the form of a memory controller 110 is also coupled to the primary bus 106 to direct data transfers between the modules 102 and 104 and the memory control circuitry 108. The memory control circuitry may include, e.g., a discrete memory controller separate from a requestor integrated circuit (IC), or any IC that controls a DRAM and could be any type of system-on-chip (SoC).

With continued reference to FIG. 1, one embodiment of the memory controller 108 employs error correction code (ECC) circuitry 110 that detects and corrects read data errors before passing the data to a Level 3 cache 112. The ECC circuitry 110 generally includes a write data ECC encoder 114 and a read data decoder 116. An interface 118 couples the memory controller 108 to the modules 102 and 104. ECC parity bits generated by the write data encoder 114 are passed along with the original data to the memory modules along the primary bus 106, and read back with the data for use in decoding read data in the read data decoder 116. The data encoding may be generated in accordance with one of many acceptable ECC algorithms including, for example, straightforward single-bit Hamming codes, to more sophisticated high-speed BCH (Bose, Ray-Chaudhuri and Hocquenghem) codes. Other ECC codes, such as Reed-Solomon codes, turbo codes, cyclic redundancy codes (CRC) and low density parity check (LDPC) codes may also be acceptable. For one specific embodiment, a "Chipkill" code is employed that is capable of correcting a single random error or four-bit burst error in a 128-bit word.

Further referring to FIG. 1, the embodiment shown illustrates a multi-drop bus, where the primary bus 106 is shared by the modules 102 and 104. Point-to-point topologies are also envisioned, but not illustrated. The modules each include respective buffer circuits 120 and 122 and memory devices 124A-124N and 126A-126N. The buffer circuits 120 and 122 isolate the memory devices from the primary bus for each module. Thus, instead of the multiple memory devices for each module loading the bus, only the buffer circuits load the bus. This minimizes capacitive loading on the shared primary bus, among other things. As explained more fully below, the buffer circuits 120 and 122 may also employ ECC circuitry to identify and repair "hard" errors associated with one or more of the various memory devices. For one embodiment, the error identification and repair is done in a manner wholly transparent to the memory controller 108, thus providing an additional layer of error correction capability that maximizes the ECC strength, or correction capability, of the coding carried out by the memory controller 108.

Figure 2:
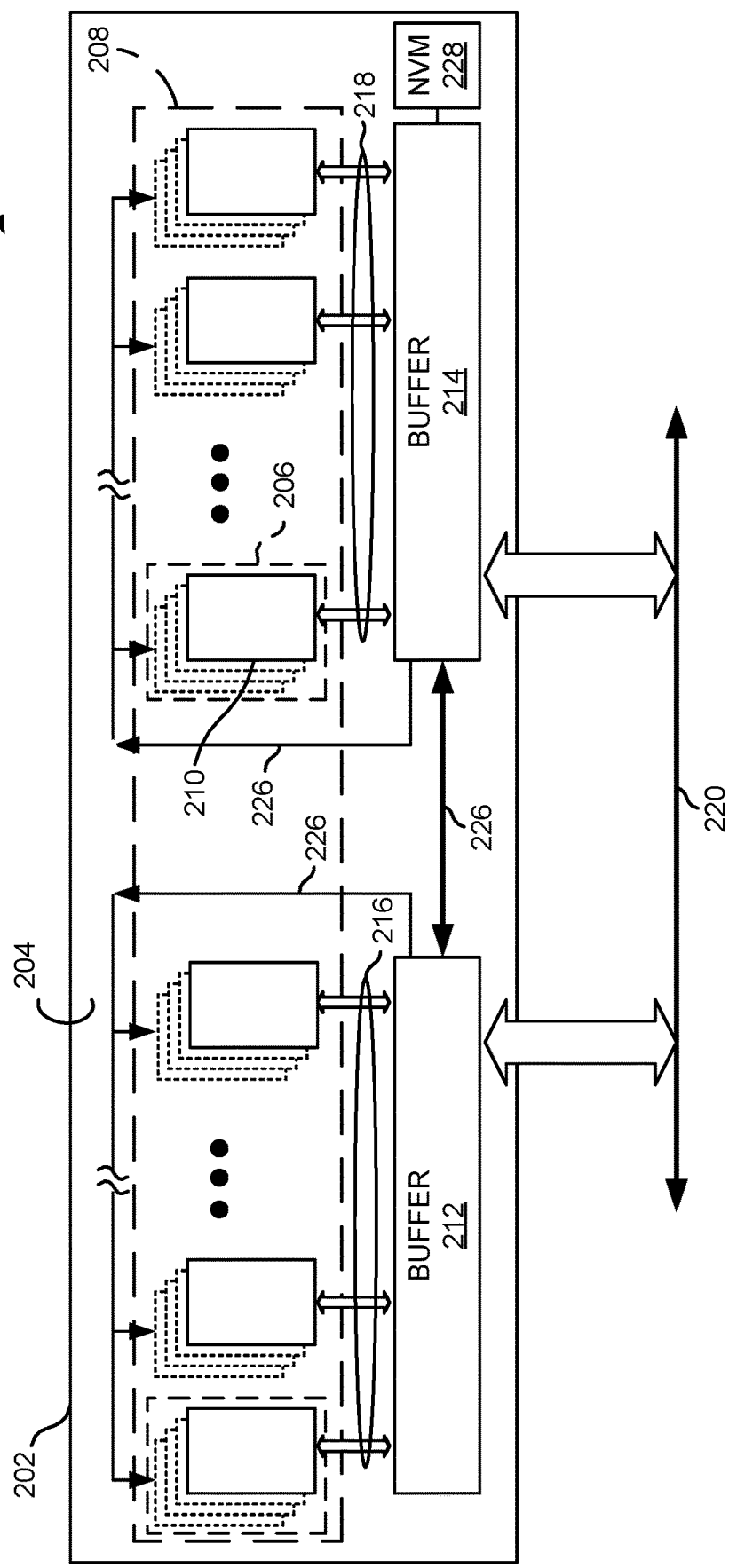
FIG. 2 illustrates one embodiment of a buffered memory module that may be used with the memory system of FIG. 1.

FIG. 2 illustrates additional detail for one embodiment of a memory module, generally designated 200, that corresponds to the memory modules 102 and 104 of FIG. 1. Each module 200 includes a substrate 202 having a front face 204 that mounts a plurality of memory devices 206. In some embodiments, the memory devices may organized as "ranks". Typically, a rank corresponds to a set of separately addressable memory devices used for a single memory access. Thus, for the example shown in FIG. 2, the memory devices are organized into a single rank 208. Each memory device 206 may be realized as a single memory chip, or packaged to include plural memory die 210 in a stacked configuration (shown in phantom). In some embodiments, an additional set of memory devices may be mounted on the back face of the module, and organized as an additional rank.

Further referring to FIG. 2, for one embodiment, the rank 208 of memory devices 206 couples to respective buffer circuits 212 and 214 via secondary data bus paths 216 and 218. Each buffer circuit 212 and 214, in turn, interfaces with a memory controller (not shown) through a primary bus 220. Secondary command buses 222 and 224 route command signals from each buffer circuit 212 and 214 to the memory devices 206 in a "fly-by" manner. A portion of a private bus 226, described more fully below, enables the buffer circuits 212 and 214 to communicate between each other. While two buffer circuits are shown in FIG. 1, the buffer circuitry may take many different forms, including, for example, a single buffer chip for sharing across all of the memory devices, or a separate buffer chip for each memory device as explained in further detail below.

With continued reference to FIG. 2, one embodiment of the module 200 includes memory 228 to store error information, as more fully explained below. The memory may take the form of a nonvolatile memory device coupled to the buffer circuits 212 and 214 to store the error information associated with errors determined during module manufacture, or during normal memory system operation.

Figure 3:
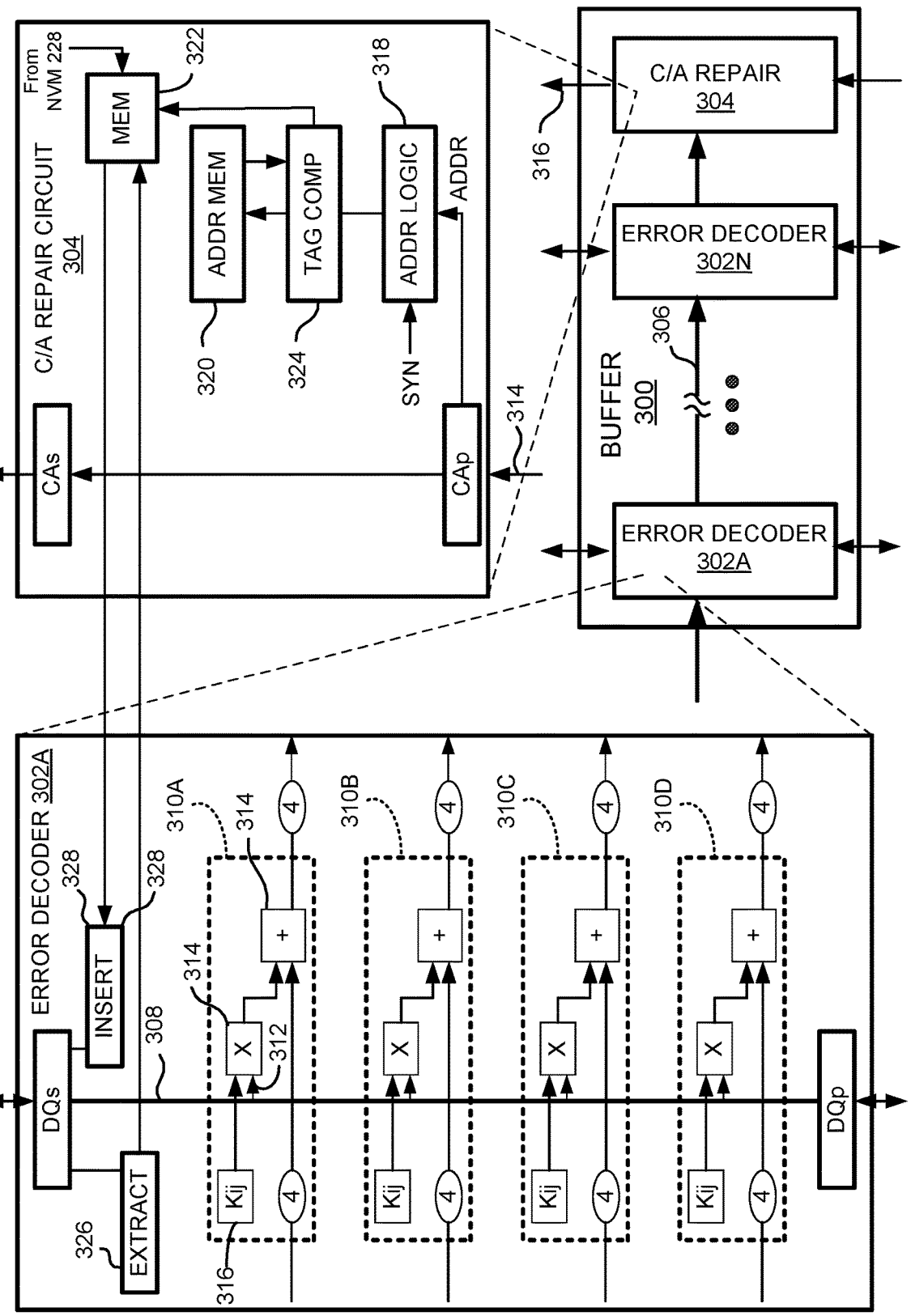
FIG. 3 illustrates an embodiment of a buffer for use with the memory module of FIG. 2, and further detail associated with specific embodiments of respective data and control/address circuits employed in the buffer.

Referring now to FIG. 3, further details for a specific embodiment of a buffer circuit 300 corresponding to those described in FIG. 2 are shown. As noted above, to enhance the error correction capabilities of the memory system, the buffer circuit 300 employs error detection decoding circuitry that is based on the error correction coding carried out by the memory controller 108 in coding write data words for transfer as write data to the memory devices. While the description that follows is implementation-specific, it is to be understood that a variety of error detection and/or correction schemes may be employed to achieve the error detection and repair functions described herein.

In one specific embodiment, and with continued reference to FIG. 3, plural error decoders 302A-302N and a command/address (C/A) repair circuit 304 are formed in each buffer 300. Each error decoder includes a copy, or "slice" of the resources needed to accomplish error detection with respect to a read data word transferred from a given memory device. The C/A repair circuit 304 evaluates error information generated by the error decoders and may assign substitute storage locations to replace defective storage locations corresponding to the detected errors. As explained more fully below, error information generated by each decoder passes to an adjacent decoder 302A-302N in a pipelined manner along a private bus 306 to the C/A repair circuit 304. In this manner, the error decoders form a series of stages along the private bus.

For the following error detection and repair circuitry descriptions below, the specific error coding algorithm employed to encode the data is a "Chipkill" error correction code having a (144, 128) format capable of correcting a single random error, or a four-bit burst error in a 128-bit word. A total of 144 bits are generated from a coding of a 128-bit data word, with the result being the original 128-bit data interspersed with 16 parity bits that, when decoded, generate an error syndrome. Similar Hamming-type coding schemes may be extended to 512 bit data chunks (576, 512), or higher. In general, decoding the syndrome following receipt of a data word allows for the detection of an error, and provides a pointer to the location of the error in the word. By detecting errors in the buffer, defective storage cells that form the basis for "hard" errors may be repaired for subsequent data reads to the defective cells. This ensures that the error correction coding generated at the controller does not become overwhelmed by errors that may develop over time, thereby maintaining its error coding strength. Further, by handling the error detecting and repair in the buffer, minimal changes to the circuitry in the memory device and/or controller are needed to achieve the desired error tracking and repair functionality.

Further referring to FIG. 3, one embodiment of the error decoder 302A employed by the buffer 300 includes a data transfer path 308, often referred to as a "DQ" path, and respective primary and secondary data interface circuits DQp and DQs. The primary interface circuit DQp sends and receives data to and from a portion of the primary data paths that couple the buffer 300 to the memory controller 108 (FIG. 1). The secondary interface circuit DQs sends and receives data to and from a portion of the secondary data paths that couple the buffer 300 to a given memory device 206 (FIG. 2). In one specific embodiment, the data transfer path 308 is 4-bits wide, to correspond to a 4-bit wide memory device. Other widths may be straightforwardly be employed, depending on the corresponding memory device widths and the application involved.

Coupled to the data transfer path 308 are plural syndrome generation circuits 310A-310D. Each syndrome generation circuit includes a parity bit path 312 to route a portion of the overall parity bits (for this specific example, 4 bits) to a multiplier 314. A Kij polynomial coefficient register 316 provides a corresponding number (here 4) of coefficients to the multiplier 314 for multiplication with the extracted parity bits. The result from the multiplier 314 is then fed to a summer 318 which performs an exclusive-OR (XOR) operation. The summer 318 is disposed in the path of a 4-bit portion of the private bus 306 and receives the output of the multiplier 314 and a shifted 4-bit portion of a syndrome associated with a prior stage error decoder. The summer 318 acts as a shift register by outputting the accumulated 4-bits along the private bus to the next adjacent error decoder. For this specific example, employing four syndrome generation circuits in parallel for each error decoder enables the generation of a 16-bit syndrome for each 128-bit read data word. The accumulating and shifting functionality carried out by the summers allows for a relatively low-cost pipelining of the error syndromes associated with various read data words from different devices to propagate to the repair circuitry with little impact on performance of the memory system as a whole.

As noted above, and still referring to FIG. 3, one embodiment of the buffer circuit 300 includes a C/A repair circuit 304 that employs repair circuitry 312 to receive the pipelined accumulated syndromes from the error decoders and carry out operations to determine faulty storage cells corresponding to "hard errors", and assign substitute storage cells for future writes to the defective cells. The C/A repair circuit 304 includes a primary C/A interface circuit CAp and a secondary C/A interface circuit CAs that connects to the primary interface circuit via C/A signal path 314. The primary C/A interface circuit Cap receives command, control and address signals corresponding to write data words transferred from the memory controller 108. The secondary interface circuit distributes command, control and address signals to the memory devices in, for example, a fly-by manner along a secondary C/A path 316.

Further referring to FIG. 3, the repair logic includes address logic 318 having a syndrome input SYN, and an address input ADDR. For error detection purposes, the address logic receives 16-bit error syndromes sequentially pipelined from error decoder to error decoder via the private bus 306, and determines if the syndromes include a pointer to a faulty bit location. Repetitive errors correlating to a "hard" error (an error caused by a structural defect, such as a faulty storage cell) are then used to generate a tag that identifies the faulty cell address, with the address stored in an address memory 320. A substitute storage cell from a redundant memory 322 is then assigned to store a bit directed to the faulty address.

For subsequent write operations to the faulty address, the address logic 318 uses a tag comparison circuit 324 to compare incoming addresses to known defective addresses stored in the address memory 320. When a "hit" is detected, indicating a matching address to a known faulty location, the bit designated for writing to the faulty cell is extracted via an extraction circuit 326 (disposed on each error decoder), and directed to the assigned substitute cell in the redundant memory 322. For data reads, an insertion circuit 328 accesses the bit in the redundant memory 322 and inserts it into the proper read data word location prior to the read data word being transferred across the DQ data path 308. For some embodiments, compare circuitry (not shown) may be employed to compare the previously determined defective bit with the repair bit to more accurately determine the presence of a "hard" or "soft" error. In this manner, if a "soft" error was involved, and did not repeat, the spare bit location may be used elsewhere, thereby freeing redundant resources.

The memory architecture above lends itself well to carrying out repairs at the manufacturing stage, such as when a memory module undergoes final assembly and test, or during normal operation as a main memory system for computing resources. Failures identified during manufacture, such as in final module assembly and test, may be repaired, and the repair information stored in the nonvolatile memory 228, until retrieved upon usage in a memory system operating environment.

Figure 4:
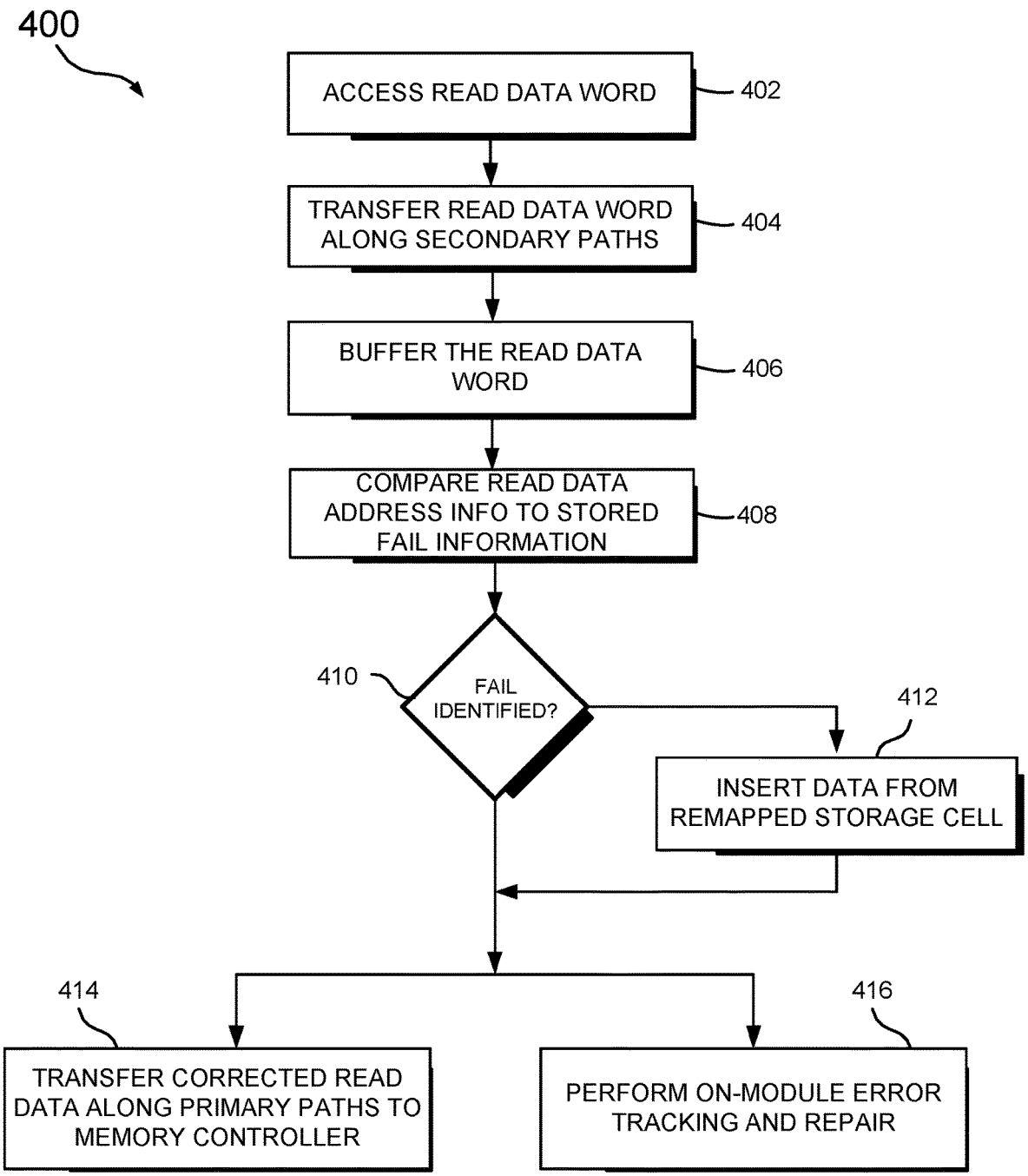
FIG. 4 illustrates a flowchart of steps that define one embodiment of a method of operation in a memory module.

FIG. 4 shows a flowchart of steps that may be performed in accordance with one embodiment of a repair method described herein, generally designated 400. The method seeks to take advantage of memory systems that employ error correction coding schemes, but without impacting the designs of the memory controller or memory devices. Thus, in response to a series of commands from the memory controller to retrieve a specified data word from a memory device, the specified data word (in this example, a 128 bit data word with an additional 16 parity bits) is accessed, at 402, and transferred from the memory device along secondary data paths, at 404, to a buffer, where the data is buffered, at 406. Address information associated with the buffered read data word is then compared to stored addresses of known failures, at 408. If the comparison results in a match, at 410, then a data bit from a remapped storage cell is inserted into the bit location of the read data word that includes the known error, at 412, and the corrected data word transferred to the memory controller over the primary data paths, at 414. Note that the correction to the data is not being carried out by a decoding of the associated ECC, but rather through a substitution of data from a redundant cell mapped to store a bit value originally intended for a defective cell. Thus, the ECC is unaffected by the known (and corrected) error. If no fail is identified, the originally-accessed read data word is transferred, at 414. As the read data word is transferred to the memory controller, a copy of the data (corrected data, if a fail was earlier identified and corrected) undergoes on-module error tracking and repair, at 416.

Figure 5:
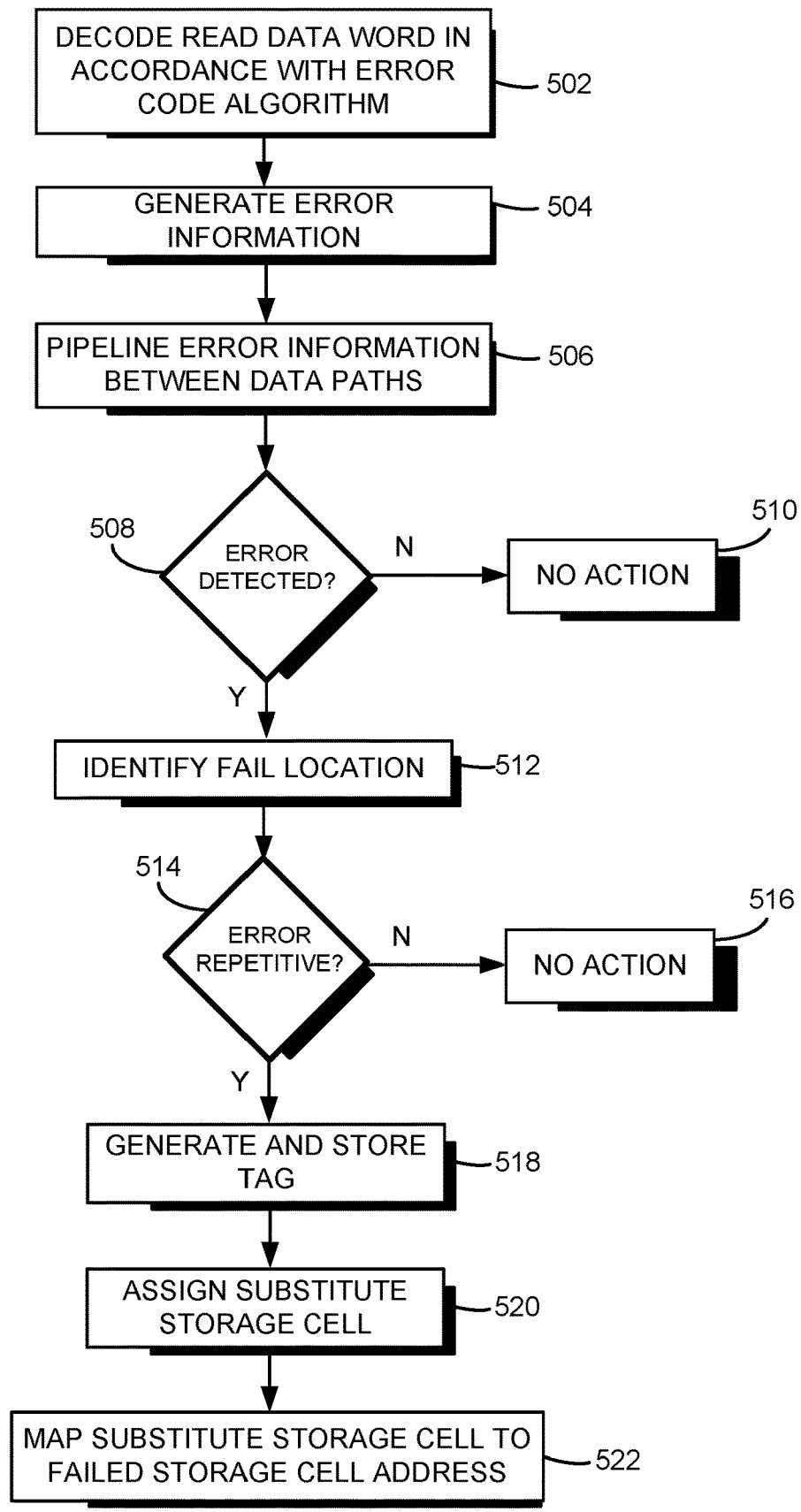
FIG. 5 illustrates a flowchart of steps that provide further detail of the error tracking and repair step of FIG. 4.

One embodiment of the error tracking and repair step 416 from FIG. 4 is shown in further detail by the flowchart of FIG. 5. The steps involve decoding the read data word in the buffer in accordance with the error coding algorithm employed by the memory controller, at 502. Error information is then generated, such as through decoding of the syndrome associated with the data word, at 504. For one specific embodiment, the syndromes may be decoded through use of multiply and divide operations consistent with multiplicand and divisor tables shown in FIG. 6 that employ possible nibbles with Kij coefficients such as those shown in the table of FIG. 7. Plural syndromes associated with plural read data words may then be sequentially pipelined along the private bus between DQ data paths, at 506, eventually arriving at the C/A repair circuitry. Note that since a repair is to be made for subsequent accesses to a failed storage cell, the currently accessed data does not undergo a correction at the buffer, but rather at the memory controller (if an error is detected).

Further referring to FIG. 5, as a syndrome arrives at the C/A repair circuitry, a determination of whether an error was detected is first carried out, at 508. This generally involves evaluating the syndrome, which not only detects the existence of an error, but also generates a pointer to the bit location of the error in the read data word. If no error is detected, no action takes place, at 510, and the next error syndrome is evaluated on a subsequent cycle. If an error is detected, then the pointer is evaluated to identify the location of the error, at 512. For some embodiments, a counter or other indicator may be employed to determine whether the error is a single event, or repetitive in nature, at 514. If the error is not repetitive (based on a predetermined threshold, for example), no further action may take place, at 516. If the error is repetitive, an assumption may be made that the error is the result of a failure in the associated memory cell, and the repair logic generates a tag entry for inclusion in the fail memory, at 518. The tag entry generally includes information such as the address information of the failed cell. For embodiments where the error tracking and repair is carried out during a memory module test operation, the failed storage addresses may be stored in nonvolatile memory mounted on the module. When the module is included within a memory system, the stored failure addresses may be accessed from the nonvolatile memory and repaired, for example, at system startup.

Further referring to FIG. 5, with the tag generated and stored in the fail memory, the repair logic may then assign a substitute storage cell, at 520, to store future data bits directed to the failed storage cell address. A mapping is then generated, at 522, that associates the failed storage location address to the newly assigned substitute storage cell. Subsequent write data directed to the failed address location will then instead be extracted from the DQ data path internal to the buffer, and directed to the substitute storage cell. Subsequent reads that include that data bit will have the bit inserted into the read data word, as explained above with respect to FIG. 4.

Figure 8:
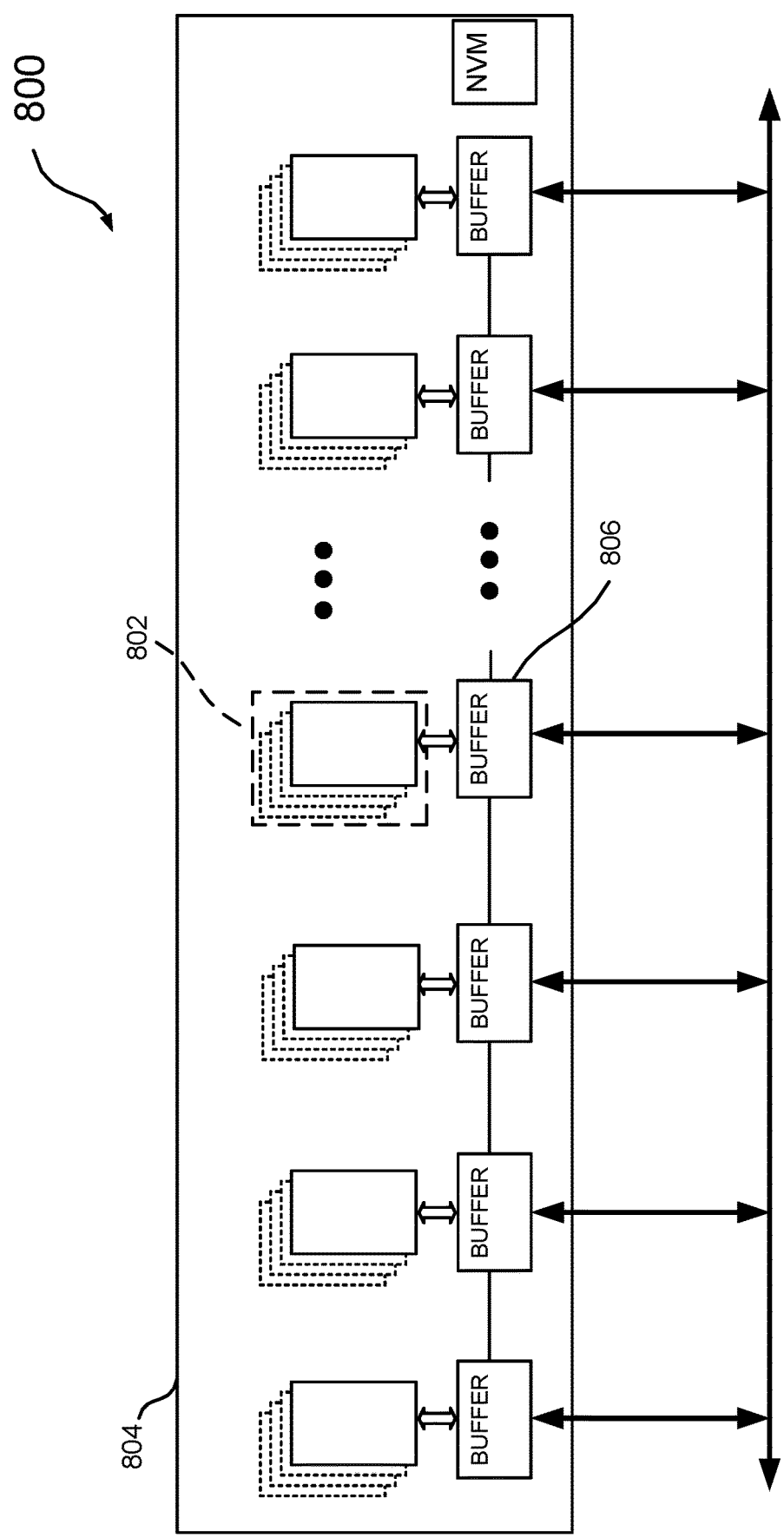
FIG. 8 illustrates an alternative embodiment of a buffered module similar to the embodiment of FIG. 2.

The memory module 200 described above is shown as a specific implementation having two shared buffer circuits 212 and 214. In some embodiments, a single buffer circuit may be shared across all of the memory devices. An alternative embodiment of a buffered memory module 800 that employs dedicated buffer circuits 802 for each memory device, often referred to as "micro-buffers", is shown in FIG. 8. The module 800 employs an architecture similar to the module 200 of FIG. 2, including memory devices 804 mounted on a module substrate 804. Buffer circuits 806 are configured to, for example, be dedicated to respective memory devices (or plural die in the case of stacked memory devices). For one embodiment, each buffer circuit may include an error decoder and associated CA logic, similar to that shown in FIG. 3, to carry out error tracking and repair on the module. While not shown in FIG. 8, micro buffers lend themselves well to being stacked with the memory devices in common packages.

For other embodiments the employ a large number of memory modules, the error tracking and repair functionality may be shared across two or more modules. In such scenarios, the private syndrome bus that interfaces the DQ data paths within the buffer circuits may be extended from one module to another via an appropriate routing scheme.

Those skilled in the art will appreciate that the various embodiments described herein improve error correction abilities for memory systems that employ error correction schemes. For embodiments that allow for corrections of an additional bit for a given data word, error coverage may be extended by several orders of magnitude. Further, for some of the embodiments described herein, changes to the memory devices or the memory controller may be minimized, and instead incorporated into a buffer circuit that lends itself well to logic process technologies.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A semiconductor device, comprising:
   a dynamic random access memory (DRAM) integrated circuit (IC) chip; and
   a logic IC chip, the logic IC chip including
     a first interface for communicating with a memory controller,
     a second interface for coupling to the DRAM IC chip, and
     repair logic to map replacement storage locations as substitute storage locations for identified error locations in the DRAM IC chip.

2. The semiconductor device according to claim 1, wherein the logic IC chip further includes error logic to identify the error locations.

3. The semiconductor device according to claim 1, further comprising:
   a substrate; and
   wherein the DRAM IC chip and the logic IC chip are mounted to the substrate.

4. The semiconductor device according to claim 3, wherein the substrate, the DRAM IC chip, and the logic IC chip cooperate to form a memory module.

5. The semiconductor device according to claim 1, wherein the DRAM IC chip and the logic IC chip are disposed in a common package.

6. The semiconductor device according to claim 5, wherein the DRAM IC chip and the logic IC chip are stacked in the common package.

7. The semiconductor device according to claim 1, wherein the logic IC chip comprises a buffer IC chip dedicated to the DRAM IC chip.

8. A logic integrated circuit (IC) chip, comprising:
   a first interface for communicating with a dynamic random access memory (DRAM) memory controller,
   a second interface for coupling to a DRAM IC chip, and
   repair logic to map replacement storage locations as substitute storage locations for identified error locations in the DRAM IC chip.

9. The logic IC chip according to claim 8, further comprising:
   error logic to identify the error locations.

10. The logic IC chip according to claim 8, further comprising:
    a packaging interface for mounting to a substrate, the substrate common to the DRAM IC chip.

11. The logic IC chip according to claim 10, wherein the packaging interface is configured for mounting to a DRAM memory module.

12. The logic IC chip according to claim 10, wherein the packaging interface is configured for stacking of the logic IC chip with the DRAM IC chip.

13. The logic IC chip according to claim 10, wherein the logic IC chip comprises a buffer IC chip dedicated to the DRAM IC chip.

14. A method of operation in an integrated circuit (IC) logic chip, the method comprising:
    interfacing with a dynamic random access memory (DRAM) memory controller along primary data paths;
    interfacing with a DRAM IC chip along secondary data paths; and
    mapping replacement storage locations as substitute storage locations for identified error locations in the DRAM IC chip.

15. The method according to claim 14, further comprising: identifying the error locations with error logic.

16. The method according to claim 14, wherein the interfacing with the DRAM IC chip is carried out via a common substrate.

17. The method of claim 14, wherein the interfacing with the DRAM IC chip is carried out via a memory module.

18. The method of claim 14, wherein the interfacing, with the DRAM IC chip is carried out within a common package.

19. The method of claim 14, wherein the interfacing, with the DRAM IC chip comprises buffering signals transferred between the DRAM memory controller and the DRAM IC chip.

20. The method of claim 14, wherein the IC logic chip operates in a I-to-I correspondence with the DRAM IC chip.

* * * * *